(12) United States Patent
Feng et al.

(10) Patent No.: US 12,052,840 B2
(45) Date of Patent: Jul. 30, 2024

(54) SLOT COVER AND INTEGRATED CIRCUIT ACCESS DEVICE

(71) Applicant: Wistron NeWeb Corporation, Hsinchu (TW)

(72) Inventors: Tzu-Mao Feng, Hsinchu (TW); Yu-Shuo Wu, Hsinchu (TW); Ju-Peng Yang, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 71 days.

(21) Appl. No.: 17/737,117

(22) Filed: May 5, 2022

(65) Prior Publication Data

US 2023/0156954 A1 May 18, 2023

(30) Foreign Application Priority Data

Nov. 18, 2021 (TW) .................................. 110142881

(51) Int. Cl.
*H05K 7/14* (2006.01)

(52) U.S. Cl.
CPC ......... *H05K 7/1474* (2013.01); *H05K 7/1405* (2013.01); *H05K 7/1454* (2013.01)

(58) Field of Classification Search
CPC .. H05K 7/1474; H05K 7/1405; H05K 7/1454; H05K 7/1487
See application file for complete search history.

(56) References Cited

U.S. PATENT DOCUMENTS

| 9,854,696 | B1* | 12/2017 | Lin | ......................... F21V 23/06 |
| 11,647,614 | B2* | 5/2023 | Latuperissa | ........ H05K 7/20754 |
| | | | | 361/679.48 |
| 2009/0243445 | A1* | 10/2009 | Vaughan | .............. H05K 7/1487 |
| | | | | 29/729 |
| 2016/0029509 | A1* | 1/2016 | House | .................. H05K 7/1487 |
| | | | | 361/679.01 |

FOREIGN PATENT DOCUMENTS

| CN | 102789278 A | * 11/2012 | ............. G06F 1/181 |
| CN | 106413329 B | * 2/2019 | ........... G11B 33/022 |
| CN | 212515614 U | 2/2021 | |
| WO | WO-2010138824 A2 | * 12/2010 | ............. G06F 1/185 |

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A slot cover and an integrated circuit access device having the slot cover are provided. The slot is used to be removably inserted into a slot of an electronic device and includes a frame, a positioning portion, an engaging portion, and at least one conductive elastic plate. The frame includes a center sheet, a first-side sheet configured to connect to an integrated circuit access module, and a second-side sheet. The first-side sheet and the second-side sheet are respectively located at a first side and a second side of the center sheet. The positioning portion and the engaging portion are respectively located above and below the center sheet. The at least one conductive elastic plate is disposed at the second-side sheet. When the slot cover is inserted in the slot of the electronic device, the center sheet blocks an opening of the slot.

13 Claims, 6 Drawing Sheets

SLOT COVER AND INTEGRATED CIRCUIT ACCESS DEVICE

CROSS-REFERENCE TO RELATED PATENT APPLICATION

This application claims the benefit of priority to Taiwan Patent Application No. 110142881, filed on Nov. 18, 2021. The entire content of the above identified application is incorporated herein by reference.

BACKGROUND

Technical Field

The present disclosure relates to a slot cover and an integrated circuit access device having the slot cover, and more particularly, to a slot cover and an integrated circuit access device configured to be inserted into an electronic device.

Description of Related Art

An integrated circuit access device generally has an integrated circuit card like solid-state drive (SSD) and may be used in servers. A latch member or a handle could be installed at a front end of the integrated circuit access device, so users can grab the integrated circuit access device by the latch member or the handle and input the integrated circuit access device into the server or remove the integrated circuit access device from the server. The latch member can further be fixed to a slot of the server to provide dustproof, antistatic, and anti-electromagnetic interference functions as well as to prevent air backflow in the server.

In practice, the integrated circuit access device is restricted to a single slot by the latch member. However, some integrated circuit access devices may be configured to have a heat sink that takes up the space of two slots. In such case, it would be difficult for a user to tell whether a slot next to the integrated circuit access device is being occupied or not, and components of the integrated circuit access device placed in the slot could be damaged by other integrated circuit access devices inserted thereinto by the user.

Hence, how to prevent the insertion of devices into occupied slots is an issue to be solved.

SUMMARY

It is an object of the present disclosure to provide a slot cover for being removably inserted into a slot of an electronic device. The slot cover includes a frame, a positioning portion, an engaging portion, and at least one conductive elastic plate. The frame has a center sheet, a first-side sheet, and a second-side sheet. The first-side sheet is located at a first side of the center sheet and is configured to connect to an integrated circuit access module, and the second-side sheet is located at a second side of the center sheet. The positioning portion is located above the center sheet, and the engaging portion is located below the center sheet. The at least one conductive elastic plate is disposed at the second-side sheet. When the slot cover is inserted in the slot of the electronic device, the center sheet blocks an opening of the slot, the positioning portion abuts against an inner top surface of the slot, and the engaging portion is restricted by a bottom groove of the slot.

It is another object of the present disclosure to provide an integrated circuit access device for being removably inserted into two adjacent slots of an electronic device. The integrated circuit access device includes an integrated circuit access module and a slot cover. The integrated circuit access module has a main body, a heat sink, and a latch cover. The heat sink is disposed at one side of the main body, and the latch cover is attached to one end of the main body and has a connecting sideboard located at the side. The slot cover is connected to the connecting sideboard and has a frame, a positioning portion, an engaging portion, and at least one conductive elastic plate. The frame includes a center sheet, a first-side sheet, and a second-side sheet. The first-side sheet is located at a first side of the center sheet and configured to connect to the integrated circuit access module and to abut to the connecting sideboard. The second-side sheet is located at a second side of the center sheet. The positioning portion is located above the center sheet, and the engaging portion is located below the center sheet. The at least one conductive elastic plate is disposed at the second-side sheet. When the integrated circuit access module is inserted into one of the two adjacent slots, the slot cover is inserted into another one of the two adjacent slots, the center sheet blocks an opening of the another one of the slots, the positioning portion abuts against an inner top surface of the another one of the slots, and the engaging portion is restricted by a bottom groove of the another one of the slot.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
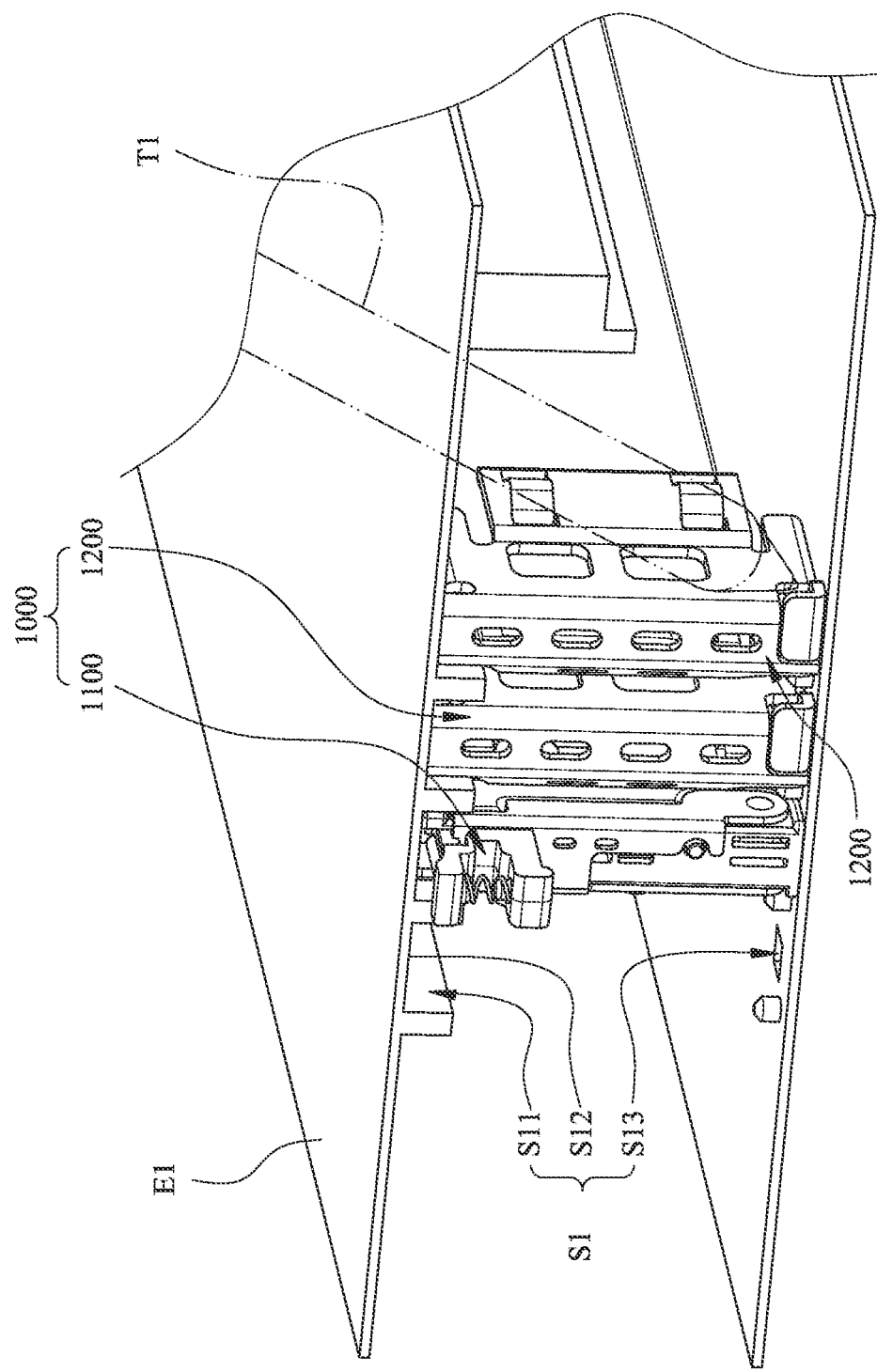
FIG. 1 is a schematic perspective view of an integrated circuit access module and a slot cover being implemented in an electronic device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
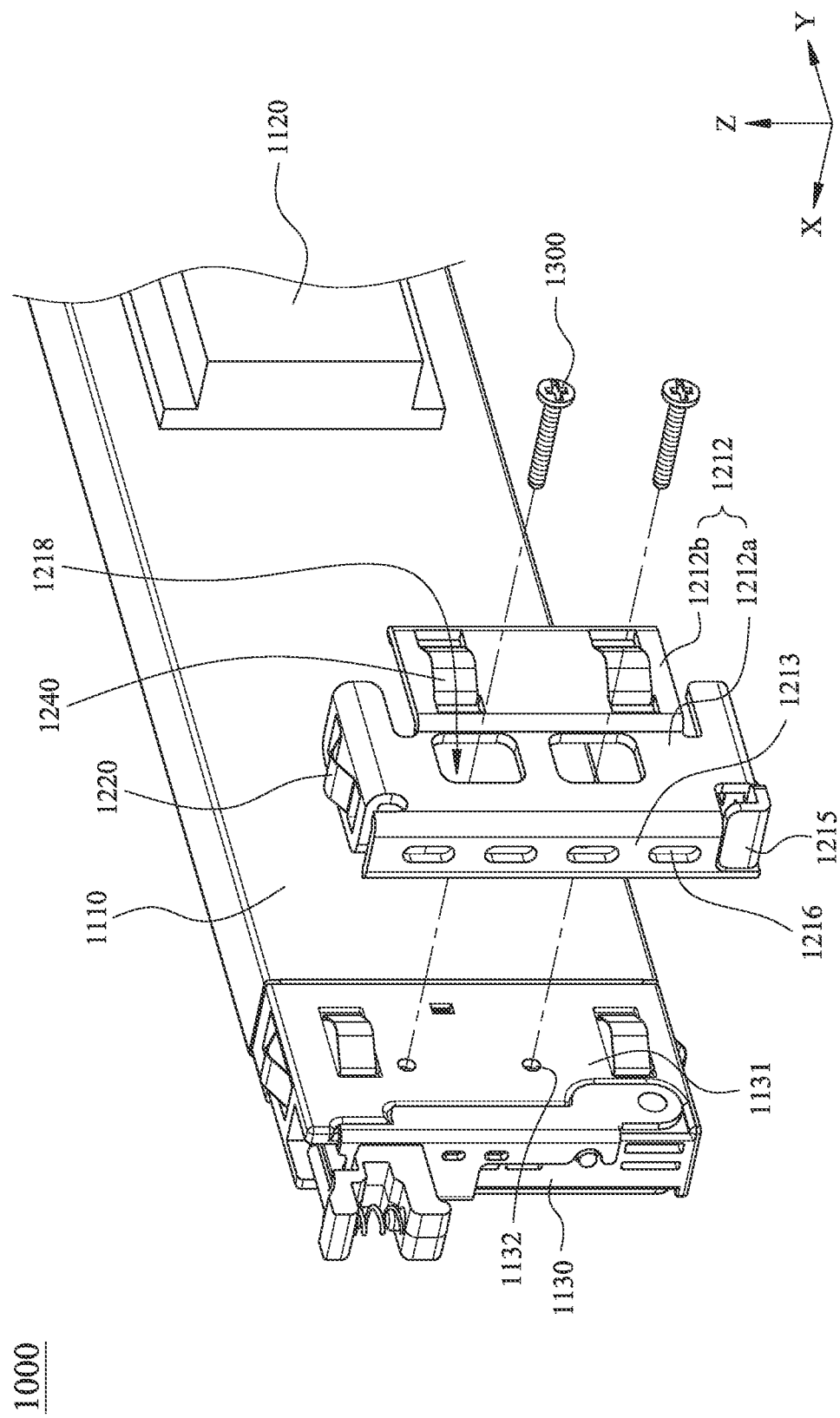
FIG. 2 is a schematic exploded view of the integrated circuit access module shown in FIG. 1.
Figure 3:
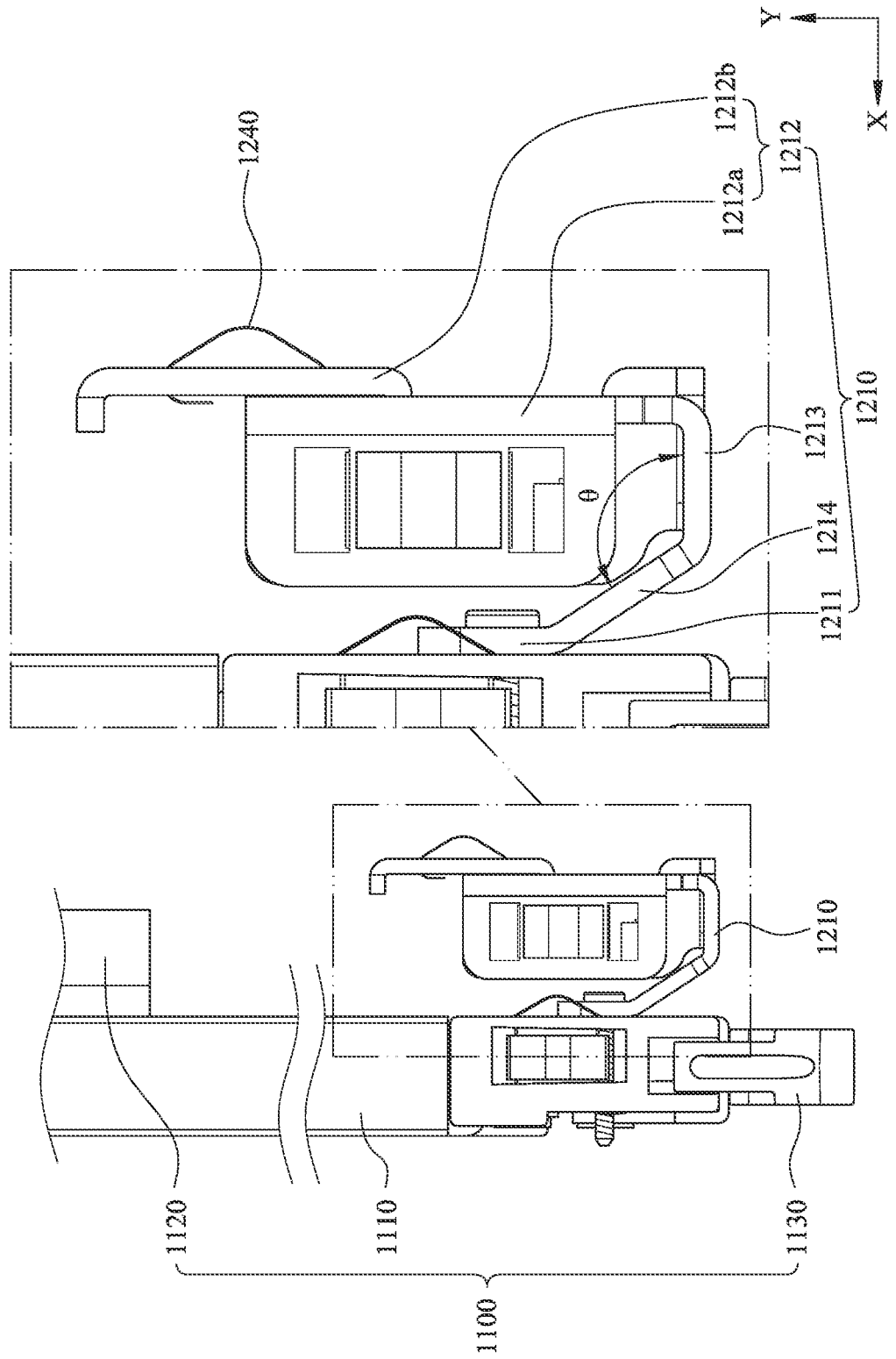
FIG. 3 is a schematic top view of the integrated circuit access module shown in FIG. 1.

Referring to FIG. 1 to FIG. 3, an integrated circuit access device 1000 and a slot cover 1200 are implemented in an electronic device E1, and a tool T1 is also shown in FIG. 1. The integrated circuit access device 1000 is configured to be removably inserted into two adjacent slots S1 of the electronic device E1 and includes an integrated circuit access module 1100 and a slot cover 1200.

The integrated circuit access module 1100 includes a main body 1110, a heat sink 1120, and a latch cover 1130. The heat sink 1120 is located at one side of the main body 1110, and the latch cover 1130 is attached to one end of the main body 1110 and includes a connecting sideboard 1131 located at the abovementioned one side of the latch cover 1130. The slot cover 1200 is connected to the connecting sideboard 1131 and includes a frame 1210, a positioning portion 1220, an engaging portion 1230 (shown in FIG. 5), and at least one conductive elastic plate 1240. The frame 1210 includes a center sheet 1213, a first-side sheet 1211, and a second-side sheet 1212. The first-side sheet 1211 is located at a first side of the center sheet 1213 and is configured to connect to the integrated circuit access module 1100 and to abut to the connecting sideboard 1131. The second-side sheet 1212 is located at a second side of the center sheet 1213.

The positioning portion 1220 is located above the center sheet 1213, and the engaging portion 1230 is located below the center sheet 1213. The at least one conductive elastic plate 1240 is disposed at the second-side sheet 1212. As the integrated circuit access module 1100 is inserted into one of the two adjacent slots S1, the slot cover 1200 is inserted into the other one of the two adjacent slots S1 (hereinafter "the other slot S1"), and when the slot cover 1200 is inserted in the other slot S1, the center sheet 1213 blocks an opening S11 of the other slot S1 while the positioning portion 1220 abuts against an inner top surface S12 of the other slot S1 and the engaging portion 1230 is restricted by a bottom groove S13 of the other slot S1.

Thus, a user is able to identify the condition of the other slot S1 because of the slot cover 1200 blocking the opening S11 of the other slot S1, and no other element would be unnecessarily inserted by the user. Moreover, the slot cover 1200 can be connected to the integrated circuit access module 1100 to form, as a whole, an integrated circuit access device 1000 and be inserted into two adjacent slots S1 at the same time as shown in FIG. 1, or it can be used alone and be inserted into a single slot S1. In other words, the slot cover 1200 is detachably connected to the integrated circuit access module 1100, and therefore the slot cover 1200 is flexible in its utility as it can be used alone/individually or in combination with the integrated circuit access module 1100. The integrated circuit access device 1000 will be described in detail below, especially the details on the slot cover 1200.

The electronic device E1 can be, for example, a server with a plurality of slots S1, and each of the slots S1 is adapted for the integrated circuit access module 1100 or the slot cover 1200 to be inserted therein. Each slot S1 has an opening S11 that is approximately rectangular in shape, and has an inner top surface S12 and an inner bottom surface on which a bottom groove S13 is disposed. The main body 1110 of the integrated circuit access module 1100 includes an external housing and an internal integrated circuit card. The heat sink 1120 and the latch cover 1130 are fixed to the external housing, and the latch cover 1130 corresponds to the opening S11 of a single slot S1 and is restricted by the bottom groove S13 of the slot S1. The structure of the electronic device E1 and the integrated circuit access module 1100 are known in the art and is not the focal point of the improvement by the present disclosure, and therefore will not be further described herein.

Figures 4, 5:
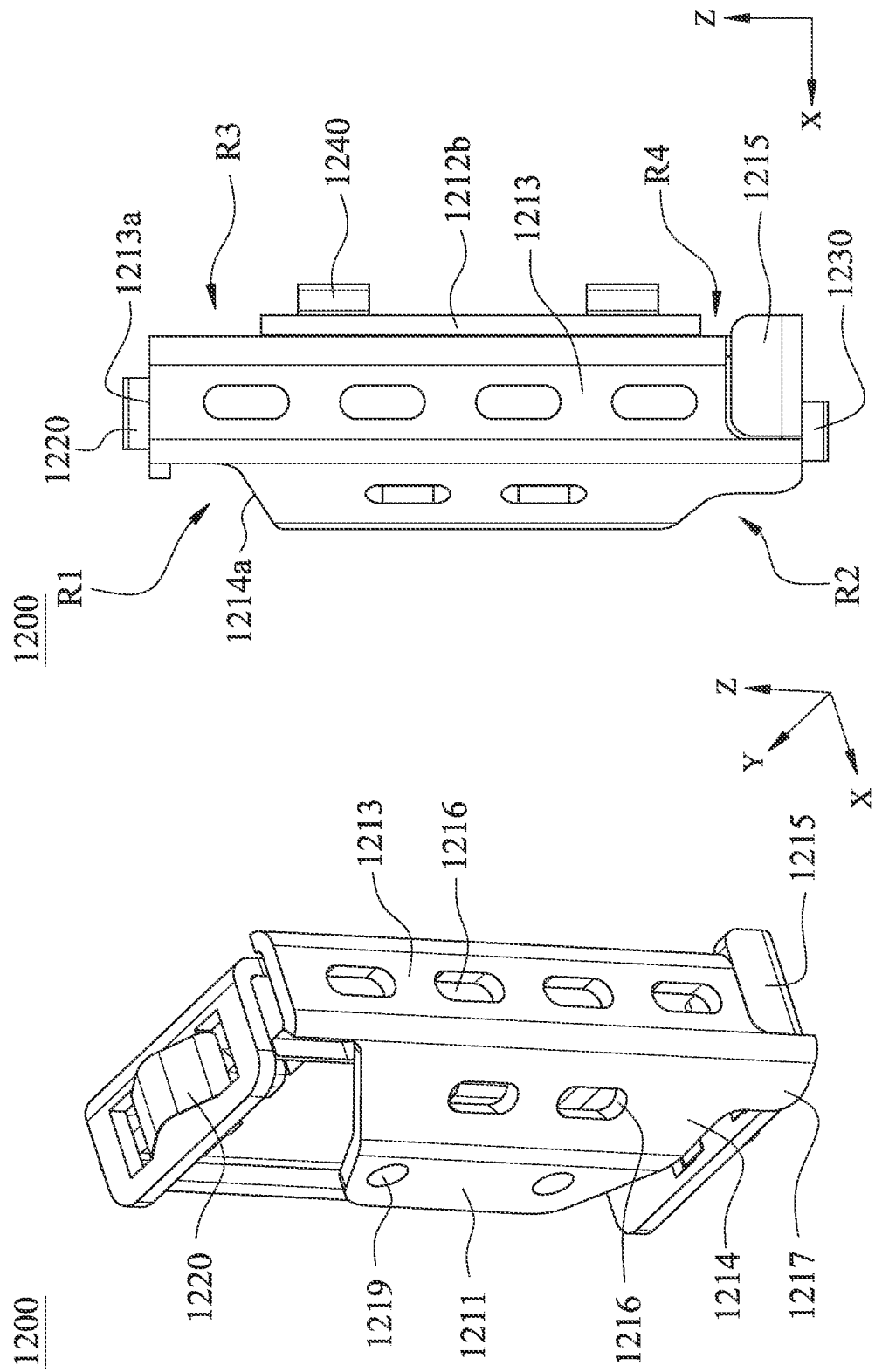
FIG. 4 is a three-dimensional schematic view of the slot cover shown in FIG. 1.
FIG. 5 is a schematic front view of the slot cover shown in FIG. 1.
Figure 6:
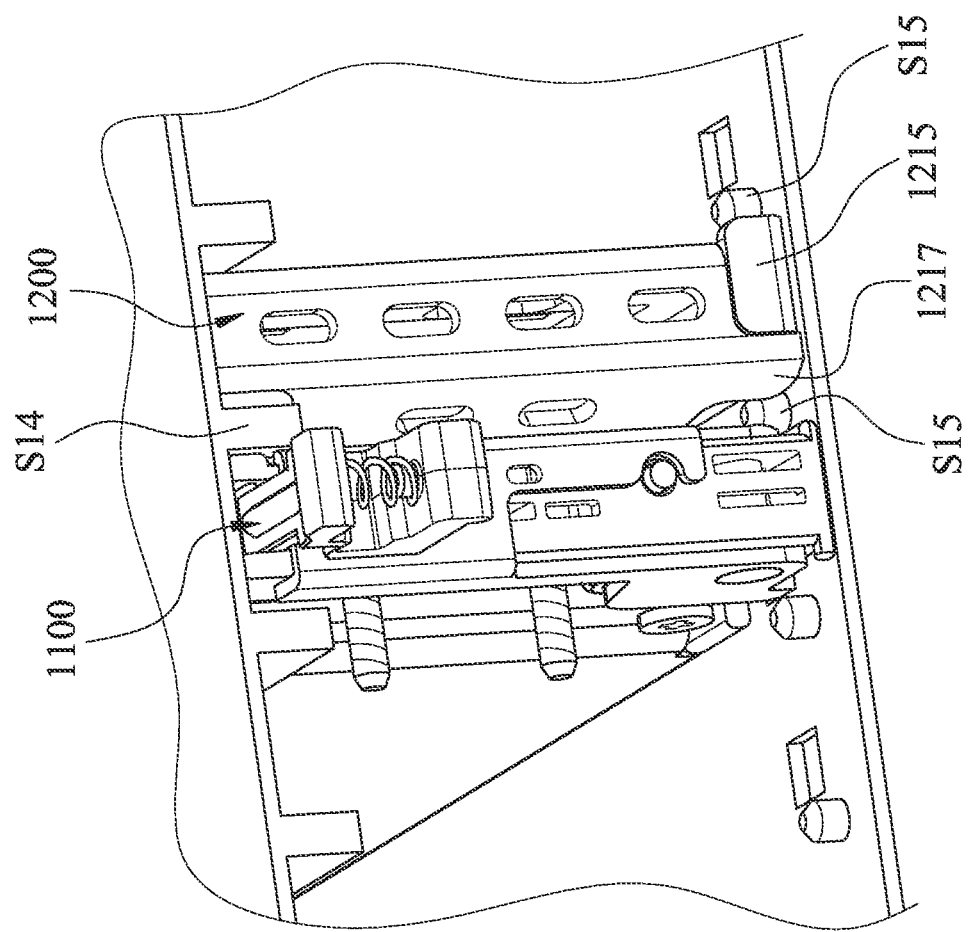
FIG. 6 is another three-dimensional schematic view of the integrated circuit access module implemented in the electronic device shown in FIG. 1.

Referring further to FIG. 4 to FIG. 6 with references of FIG. 1 to FIG. 3, the frame 1210 further includes a slanted sheet 1214 as shown in FIG. 3 and FIG. 4. The slanted sheet 1214 is integrally connected between the center sheet 1213 and the first-side sheet 1211, and an included angle $\theta$ is formed between the slanted sheet 1214 and the center sheet 1213. The included angle $\theta$ is between 105 degrees to 135 degrees.

In specific, the frame 1210 is, for example, made of a sheet metal material and pre-cut to a predetermined shape, and the slanted sheet 1214 is formed by a bent portion from the frame 1210 toward a depth direction Y of the slot cover 1200 at an angle of 45 degrees to 75 degrees. The first-side sheet 1211 is bent from the slanted sheet 1214 and extends in parallel to the depth direction Y so as to abut to the latch cover 1130. The second-side sheet 1212 is formed by perpendicular bending the frame 1210 toward the depth direction Y, and the second-side sheet 1212 is further bent and extended to form a top sheet located above the center sheet 1213 and to form a bottom sheet located below the center sheet 1213. However, the frame 1210 of the present disclosure is not limited by the abovementioned process.

The positioning portion 1220 may be disposed at the top sheet, and the engaging portion 1230 may be disposed at the bottom sheet. More specifically, each of the positioning portion 1220 and the engaging portion 1230 has a conductive metal elastic plate structure, which allows the positioning portion 1220 to be deformed so as to abut against the inner top surface S12 and allows the engaging portion 1230 to be deformed before being restored and engaged with the bottom groove S13.

Moreover, the second-side sheet 1212 further includes a first-step portion 1212a and a second-step portion 1212b. The first-step portion 1212a is integrally connected to the center sheet 1213, and the second-step portion 1212b is integrally connected to the first-step portion 1212a and protrudes more outward in a width direction X of the slot cover 1200 than the first-step portion 1212a. The at least one conductive elastic plate 1240 is disposed at the second-step portion 1212b. In particular, the quantity of the at least one conductive elastic plate 1240 is two, and the two conductive elastic plates 1240 are disposed in a spaced-apart arrangement along a height direction Z of the slot cover 1200. The conductive elastic plate 1240 provides antistatic and anti-electromagnetic interference functions, and these effects are further enhanced through the protruding second-step portion 1212b which narrows the gap between the first side and the second side as the slot cover 1200 is inserted in the slot S1.

As shown in FIG. 4 and FIG. 6, the frame 1210 further includes a blocking portion 1217 which protrudes and extends downward from the slanted sheet 1214 along the height direction Z. When the slot cover 1200 is inserted in the slot S1, the blocking portion 1217 corresponds to a pin S15 inside the slot S1, and if the slot cover 1200 were to be pushed inward with an excessive force, the blocking portion 1217 would abut against the pin S15 to prevent the slot cover 1200 from being pushed too deep into the slot S1.

As shown in FIG. 5 and FIG. 6, the center sheet 1213 has an upper edge 1213a, and the slanted sheet 1214 has a slanted edge 1214a. A gap between the upper edge 1213a and the slanged edge 1214a along the height direction Z of the slot cover 1200 forms a first yielding space R1, and the first yielding space R1 corresponds to a separation board S14 of the slot S1. More particularly, through the height difference between the slanted sheet 1214 and the center sheet 1213, the slot cover 1200 does not interfere with the separation board S14. The slanted edge 1214a further includes a slope structure, which increases the connecting length between center sheet 1213 and the slanted sheet 1214 and therefore enhances the structural strength. In addition, besides forming the first yielding space R1, the frame 1210 may also be bent to form a second yielding space R2 located next to the blocking portion 1217 and at the first side of the center sheet 1213 where the first yielding space R1 corresponds, and to form a third yielding space R3 and a fourth yielding space R4 at the second side of the center sheet 1213, but the present disclosure is not limited thereto.

As shown in FIG. 2, FIG. 4, and FIG. 5, the frame 1210 further includes at least one fixing hole 1219 and at least one through hole 1218. The at least one fixing hole 1219 is disposed at the first-side sheet 1211, and the at least one through hole 1218 is disposed at the first-step portion 1212a and corresponds to the at least one fixing hole 1219. The integrated circuit access device 1000 further includes at least one fastener 1300, and the latch cover 1130 further includes at least one mounting hole 1132. The at least one mounting hole 1132 is disposed at the connecting sideboard 1131, and through the at least one through hole 1218, a fastening tool is able to fasten the at least one fastener 1300 in the at least one mounting hole 1132 and the at least one fixing hole 1219. For example, when the at least one fastener 1300 has a screw-like structure and the quantity of the at least one fastener 1300 is two, the quantities of the at least one through hole 1218, the at least one mounting hole 1132, and the at least one fixing holes 1219 are all two. In other embodiments, the quantities of the through holes, the mounting holes, and the fixing holes are not limited, and the fastener may have a push-pin structure so that the slot cover and the latch cover are detachably connected; or, the fastener may have a rivet structure or a blind rivet structure so that the slot cover and the latch cover are fixedly connected. Moreover, the slot cover and the latch cover may also be fixed directly by hot-melting so that the two are non-detachably connected, but the present disclosure is not limited thereby.

To improve heat-dissipation or airflow in the electronic device E1, the frame 1210 further includes at least one venting hole 1216 disposed at at least one of the center sheet 1213 and the slanted sheet 1214. As shown in FIG. 4, the quantity of the at least one venting hole 1216 is six, among which two venting holes 1216 are disposed at the slanted sheet 1214 and four venting holes 1216 are disposed at the center sheet 1213, however, the quantity, shape, location of the venting hole 1216 are adjustable according to practical needs.

In addition, the frame 1210 further includes a hook portion 1215 located below the center sheet 1213 as shown in FIG. 1, FIG. 2, and FIG. 6. The hook portion 1215 works with a tool T1 to release the restriction between the slot cover 1200 and the slot S1. In specific, the hook portion 1215 is formed by bending the bottom sheet toward the height direction Z, and the first-step portion 1212a has a missing-corner at its bottom. A groove portion is formed between the hook portion 1215 and the missing-corner, and the tool T1, such as a pen, is inserted into the groove portion to push the hook portion 1215 outward so as to pull out the slot cover 1200. Moreover, the hook portion 1215 is slightly more protruded than the second side of the center sheet 1213, such that the hook portion 1215 corresponds to another pin S15 of the slot S1 and provides blocking function.

Figure 7:
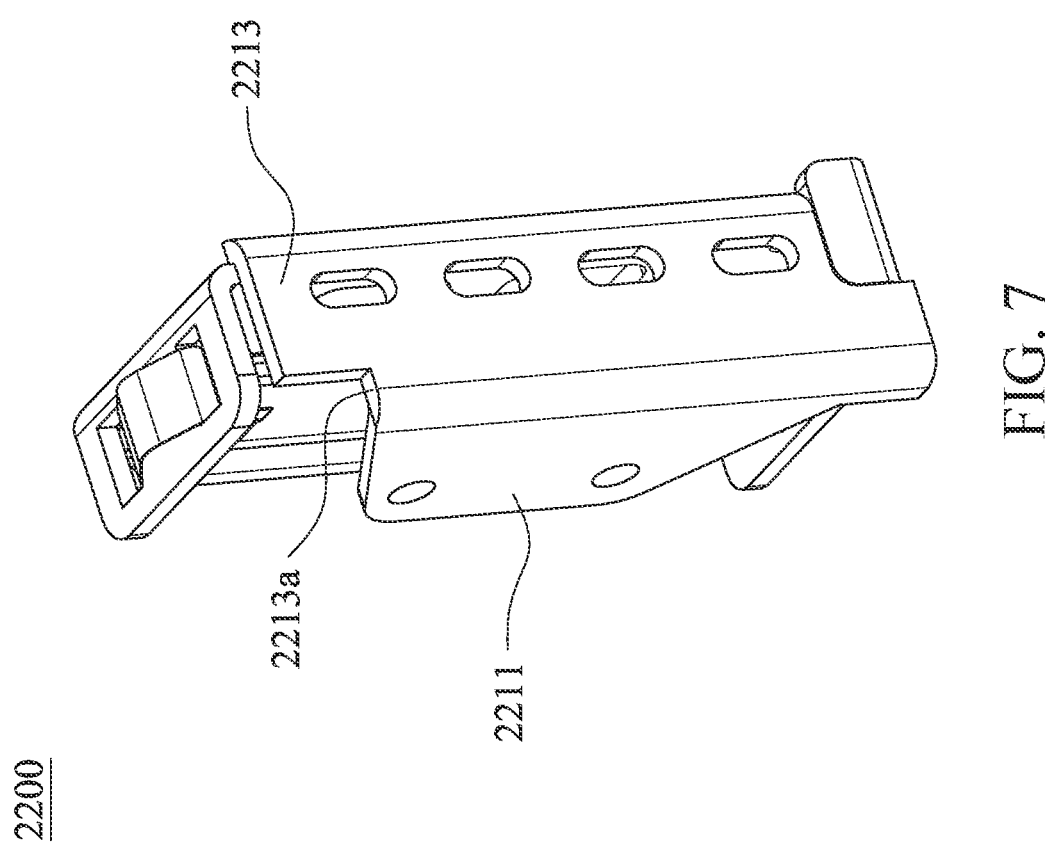
FIG. 7 is a three-dimensional schematic view of a slot cover according to another embodiment of the present disclosure.

Referring to FIG. 7, a slot cover 2200 according to another embodiment of the present disclosure is illustrated. The slot cover 2200 is similar to the slot cover 1200 in FIG. 1 to FIG. 6, and the difference is that the slot cover 2200 does not have the slanted sheet 1214. Instead, the first-side sheet 2211 of the slot cover 2200 is defined by a direct and perpendicular bent portion from the frame (not marked in FIG. 7) along the depth direction (not marked in FIG. 7) of the slot cover 2200. The center sheet 2213 includes a notch 2213a that corresponds to the separation board (not marked in FIG. 7) of the slot (not marked in FIG. 7). In other words, the first yielding space (not marked in FIG. 7) in the embodiment in FIG. 7 is defined by the notch 2213a which is also able to prevent interference.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A slot cover for being removably inserted into a slot of an electronic device, the slot cover comprising:
    a frame, comprising:
    a center sheet;
    a first-side sheet, located at a first side of the center sheet and configured to detachably fasten to an integrated circuit access module;
    a second-side sheet, located at a second side of the center sheet; and
    a slanted sheet integrally connected between the center sheet and the first-side sheet, wherein an included angle of 105 degrees to 135 degrees is formed between the slanted sheet and the center sheet;
    a positioning portion, located above the center sheet;
    an engaging portion, located below the center sheet; and
    at least one conductive elastic plate, disposed at the second-side sheet;
    wherein, when the slot cover is inserted in the slot of the electronic device, the center sheet blocks an opening of the slot, the positioning portion abuts against an inner top surface of the slot, and the engaging portion is restricted by a bottom groove of the slot.

2. The slot cover according to claim 1, wherein the center sheet has an upper edge, the slanted sheet has a slanted edge, and a gap between the slanted edge and the upper edge along a height direction of the slot cover forms a first yielding space that corresponds to a separation board of the slot.

3. The slot cover according to claim 2, wherein the frame further comprises a blocking portion extending and protruding downward from the slanted sheet along the height direction, and when the slot cover is inserted in the slot of the electronic device, the blocking portion corresponds to a pin inside the slot.

4. The slot cover according to claim 2, wherein the frame further comprises at least one venting hole disposed at at least one of the center sheet and the slanted sheet.

5. The slot cover according to claim 1, wherein the first-side sheet is formed by perpendicularly bending the frame along a depth direction of the slot cover, and the center sheet has a notch corresponding to a separation board of the slot.

6. The slot cover according to claim 1, wherein each of the positioning portion and the engaging portion has a conductive metal elastic plate structure.

7. A slot cover for being removably inserted into a slot of an electronic device, the slot cover comprising:
a frame, comprising:
a center sheet;
a first-side sheet, located at a first side of the center sheet and configured to detachably fasten to an integrated circuit access module; and
a second-side sheet, located at a second side of the center sheet and comprising:
a first-step portion, integrally connected to the center sheet; and
a second-step portion, integrally connected to the first-step portion and protruding more outward along a width direction of the slot than the first-step portion;
a positioning portion, located above the center sheet;
an engaging portion, located below the center sheet; and
at least one conductive elastic plate, disposed at the second-side sheet;
wherein the at least one conductive elastic plate is disposed at the second-step portion.

8. The slot cover according to claim 7, wherein a quantity of the at least one conductive elastic plate is two, and the two conductive elastic plates are arranged spaced apart along a height direction of the slot cover.

9. The slot cover according to claim 7, wherein the frame further comprises at least one fixing hole and at least one through hole, the at least one fixing hole is disposed at the first-side sheet, and the at least one through hole is disposed at the first-step portion and corresponds to the at least one fixing hole.

10. The slot cover according to claim 7, wherein the frame further comprises a hook portion located below the center sheet, and the hook portion is configured to work in combination with a tool to release a restriction between the slot cover and the slot.

11. An integrated circuit access device, for being removably inserted into two adjacent slots of an electronic device, the integrated circuit access device comprising:
an integrated circuit access module, comprising:
a main body;
a heat sink, disposed at one side of the main body; and
a latch cover, attached to one end of the main body and comprising a connecting sideboard located at the side of the main body; and
a slot cover, connected to the connecting sideboard and comprising:
a frame, comprising:
a center sheet;
a first-side sheet, located at a first side of the center sheet and configured to connect to the integrated circuit access module and to abut to the connecting sideboard; and
a second-side sheet, located at a second side of the center sheet;
a positioning portion, located above the center sheet;
an engaging portion, located below the center sheet; and
at least one conductive elastic plate, disposed at the second-side sheet;
wherein, when the integrated circuit access module is inserted into one of the slots, the slot cover is inserted into another one of the slots, the center sheet blocks an opening of the another one of the slots, the positioning portion abuts against an inner top surface of the another one of the slots, and the engaging portion is restricted by a bottom groove of the another one of the slots.

12. The integrated circuit access device according to claim 11, further comprising at least one fastener, the latch cover further comprising at least one mounting hole disposed at the connecting sideboard, the frame further comprising at least one fixing hole and at least one through hole, wherein the at least one fixing hole is disposed at the first-side sheet and corresponds to the at least one mounting hole, the at least one through hole is disposed at the second-side sheet and corresponds to the at least one fixing hole, and through the at least one through hole, the at least one fastener is fastened to the at least one mounting hole and the at least one fixing hole by a fastening tool.

13. The integrated circuit access device according to claim 11, wherein the slot cover is non-detachably connected to the latch cover.

* * * * *